(12) United States Patent
Yano (10) Patent No.: US 8,283,919 B2
(45) Date of Patent: Oct. 9, 2012

(54) MAGNETIC SENSOR AND ELECTRONIC DEVICE INCLUDING THE SAME

(75) Inventor: Shinji Yano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 299 days.

(21) Appl. No.: 12/706,770

(22) Filed: Feb. 17, 2010

(65) Prior Publication Data

US 2010/0207621 A1 Aug. 19, 2010

(30) Foreign Application Priority Data

Feb. 17, 2009 (JP) ................................. 2009-034303

(51) Int. Cl.
*G01R 33/02* (2006.01)
(52) U.S. Cl. ............... 324/247; 324/207.11; 324/207.26
(58) Field of Classification Search .................. None
See application file for complete search history.

(56) References Cited

U.S. PATENT DOCUMENTS 6,100,680 A * 8/2000 Vig et al. .................... 324/207.2
2008/0048772 A1* 2/2008 Nishikawa ..................... 327/544

FOREIGN PATENT DOCUMENTS

JP 2005-214900 8/2005
JP 2008-32424 2/2008

* cited by examiner

*Primary Examiner* — Huy Q Phan
*Assistant Examiner* — Temilade S Rhodes-Vivour
(74) *Attorney, Agent, or Firm* — Fish & Richardson P.C.

(57) ABSTRACT

A magnetic sensor according to the invention includes: a detector detecting the intensity of magnetic field; a comparison portion comparing the result of the detection with a set threshold value and outputting an output signal corresponding to the result of the comparison; and a threshold-value adjuster adjusting the threshold value. Thus, inconveniences due to a reverse magnetic field phenomenon or magnetic-field offset phenomenon can be solved as simple as possible.

15 Claims, 10 Drawing Sheets

Set greater than the N-pole-side maximum value of the magnetic flux density B in the N-pole direction

FIG.9

Set greater than the N-pole-side maximum value of the magnetic flux density B in the N-pole direction

MAGNETIC SENSOR AND ELECTRONIC DEVICE INCLUDING THE SAME

This application is based on Japanese Patent Application No. 2009-34303 filed on Feb. 17, 2009, the contents of which are hereby incorporated by reference.

BACKGROUND OF THE INVENTION

1. Field of the Invention

The present invention relates to a magnetic sensor that detects the intensity of magnetic field and to an electronic device provided with the magnetic sensor.

2. Description of Related Art

Conventionally, among electronic devices that can be deformed owing to a folding mechanism, sliding mechanism, or the like, those using a magnetic sensor so that the deformed state can be detected are disclosed in, for example, JP-A-2008-32424 and JP-A-2005-214900. Hereinafter, with reference to FIGS. 12 to 15, a description will be given of how the magnetic sensor is used.

Figure 12:
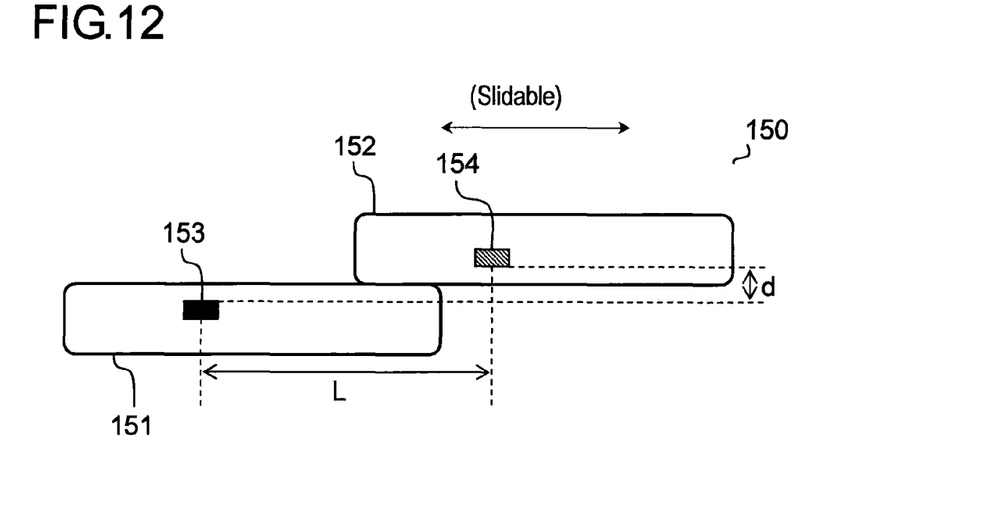
FIG. 12 is an explanatory diagram related to a usage pattern of the magnetic sensor (in a sliding-type device)

As shown in FIG. 12, an electronic device (e.g., a cellular telephone) 150 includes a first casing 151 and a second casing 152 that are connected via a sliding mechanism. First, a description will be given of an electronic device (a sliding-type device) in which the second casing 152 is slidable with respect to the first casing 151. In the sliding-type device, a magnetic sensor 153 is arranged in the first casing 151, and a magnet 154 is arranged in the second casing 152. With respect to the distance from the magnetic sensor 153 to the magnet 154, let the distance in the sliding direction be L, and the distance in a direction perpendicular to the sliding direction be d.

Figure 13:
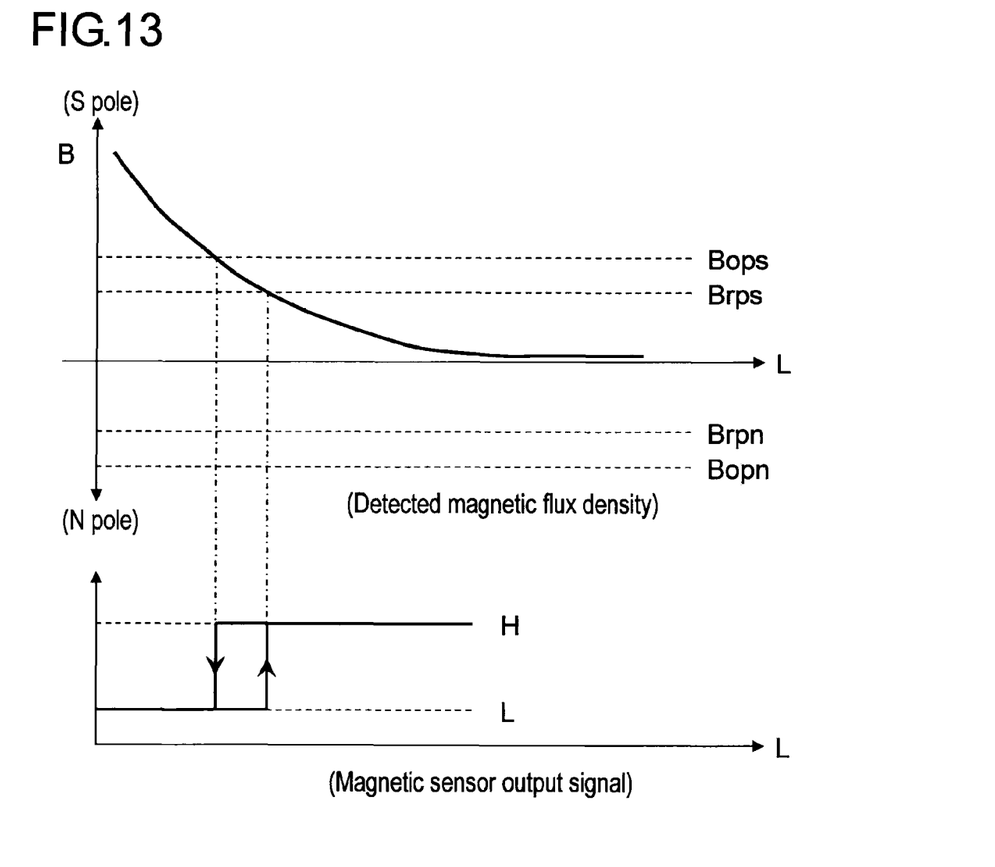
FIG. 13. is an explanatory diagram related to the operation of the magnetic sensor in the sliding-type device.

In this case, if a sufficient distance d is secured, the relationship between magnetic flux density B detected by the magnetic sensor 153 and distance L is roughly as shown in an upper part of FIG. 13. That is, the greater the distance L (the greater the sliding amount), the greater the distance from the magnetic sensor 153 to the magnet 154, and thus the detected magnetic flux density B tends to be low.

Thus, as the magnetic sensor 153, one is used that switches an output signal, as shown in a lower part of FIG. 13, from H level to L level when the magnetic flux density B becomes larger than a predetermined threshold value Bops and from the L level to the H level when the magnetic flux density B becomes smaller than a predetermined threshold value Brps. This makes it possible for the electronic device 150 to detect the state of the output signal of the magnetic sensor 153 and thus to detect the deformed state of the electronic device 150.

Figure 14:
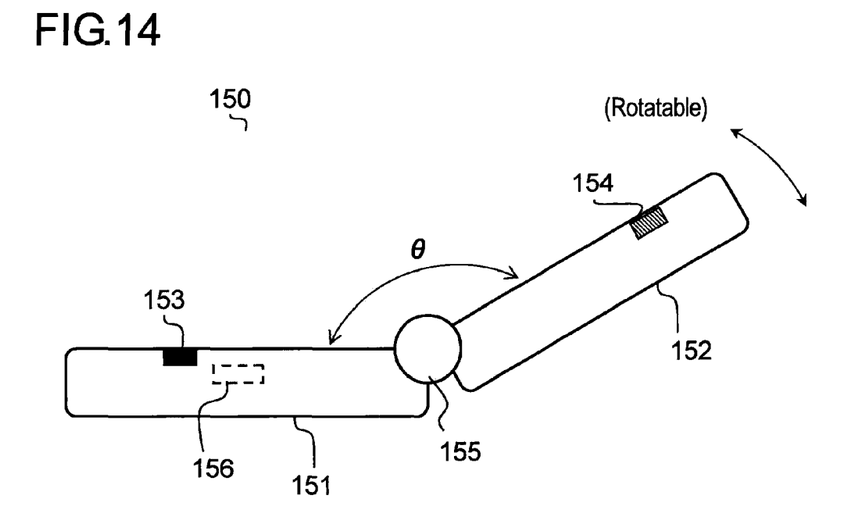
FIG. 14 is an explanatory diagram related to another usage pattern of the magnetic sensor (in a folding-type device)

Next, a description will be given of an electronic device (a folding-type device) comprising, as shown in FIG. 14, an electronic device 150 including a first casing 151 and a second casing 152 that are connected via a hinge mechanism 155, the second casing 152 being able to be opened/closed with respect to the first casing 151. In the folding-type device, a magnetic sensor 153 is arranged in the first casing 151, and a magnet 154 is arranged in the second casing 152. Let the angle formed by the first casing 151 and the second casing 152 be θ.

Figure 15:
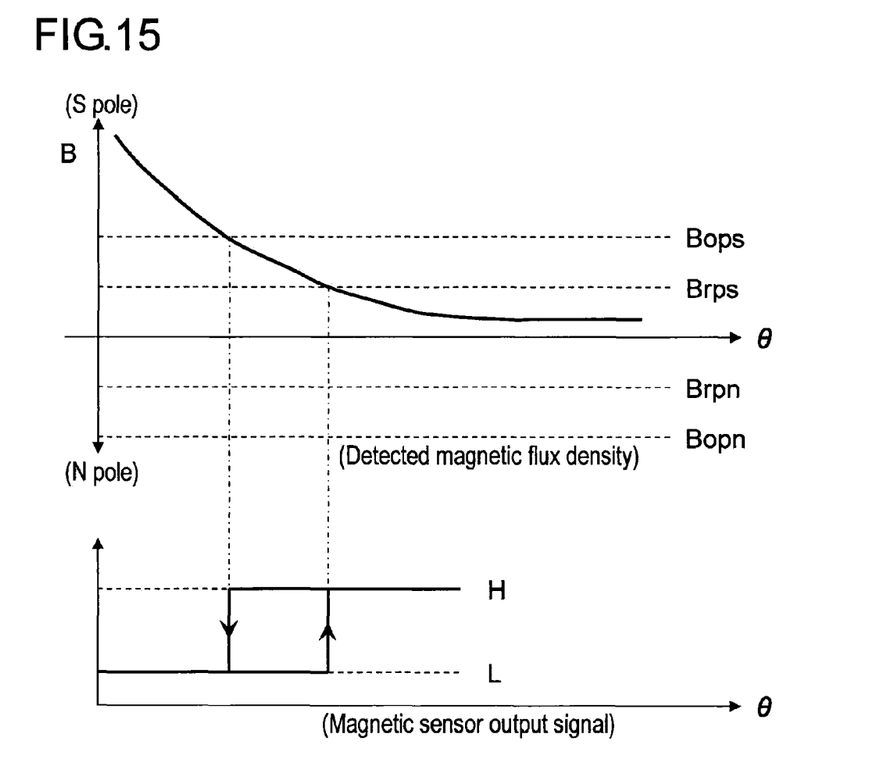
FIG. 15 is an explanatory diagram related to the operation of the magnetic sensor in the folding-type device.

In this case, if the influence of another magnetic body (other than the magnet 154) is sufficiently small, the relationship between the magnetic flux density B detected by the magnetic sensor 153 and the angle θ is roughly as shown in an upper part of FIG. 15. That is, the greater the angle θ (the more it is close to the fully open state with respect to the closed state), the greater the distance from the magnetic sensor 153 to the magnet 154, and thus, the detected magnetic flux density B tends to be low.

Thus, as the magnetic sensor 153, one is used that switches an output signal, as shown in a lower part of FIG. 15, from the H level to the L level when the magnetic flux density B becomes larger than a predetermined threshold value Bops and from the L level to the H level when the magnetic flux density B becomes smaller than a predetermined threshold value Brps. This makes it possible for the electronic device 150 to detect the state of the output signal of the magnetic sensor 153 so as to detect the deformed state of the electronic device 150.

The magnetic sensor 153 described above can detect the intensity of magnetic field at both poles. Specifically, the magnetic sensor 153 switches the output signal from the H level to the L level when the magnetic flux density B is, in the N-pole direction, over a predetermined threshold value Bopn (of opposite polarity from but equal magnitude to Bops). In addition, the magnetic sensor 153 switches the output signal from the L level to the H level when the magnetic flux density B is, in the N-pole direction, below a predetermined threshold value Brpn (of opposite polarity from but equal magnitude to Brps). This makes it possible for the electronic device 150 to properly detect its deformed state irrespective of the fitting direction of the magnet 154.

Figure 16:
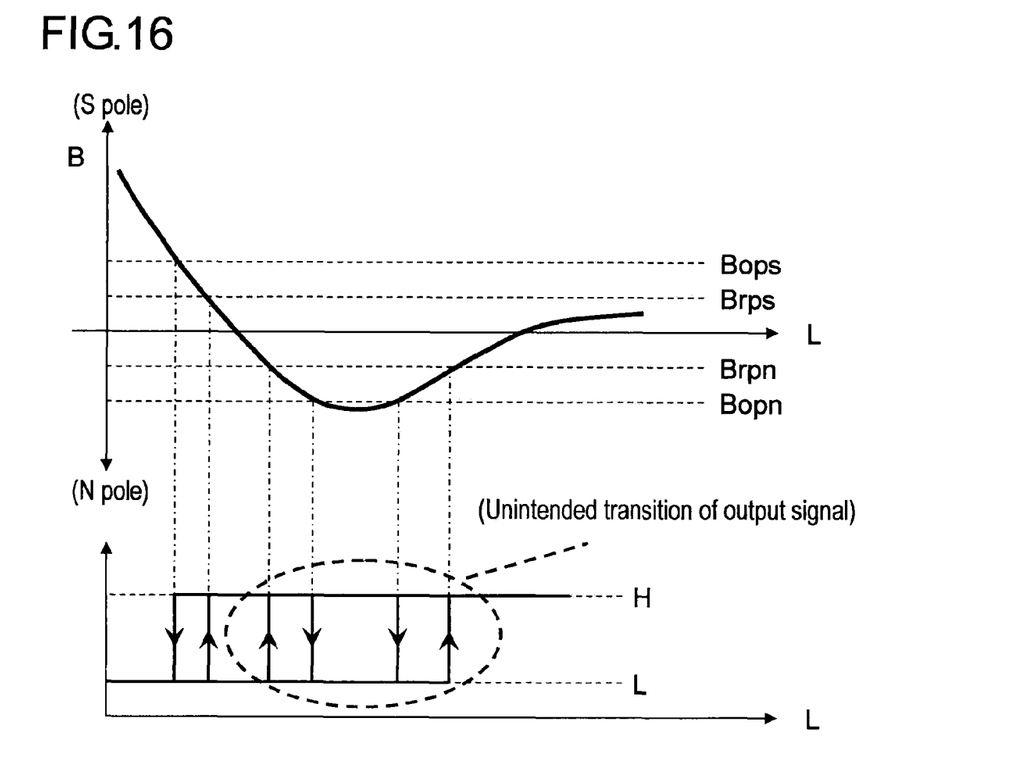
FIG. 16 is an explanatory diagram related to the reverse magnetic field phenomenon.

In the sliding-type device mentioned above, if the distance d is set relatively small, the relationship between the magnetic flux density B detected by the magnetic sensor 153 and the distance L may be, for example, as shown in an upper part of FIG. 16. Specifically, the magnetic sensor 153 may be strongly influenced by the reverse magnetic field caused by the magnet 154, and thus a phenomenon may occur in which the magnetic flux density B exceeds Bopn in the N-pole direction (hereinafter, such a phenomenon is referred to as the "reverse magnetic field phenomenon" for the sake of convenience).

When the reverse magnetic field phenomenon occurs, the state transition of the output signal occurs with unintended timing as shown in a lower part of FIG. 16. Thus, in the electronic device 150, there arise inconveniences such as erroneous detection of the deformed state.

Figure 17:
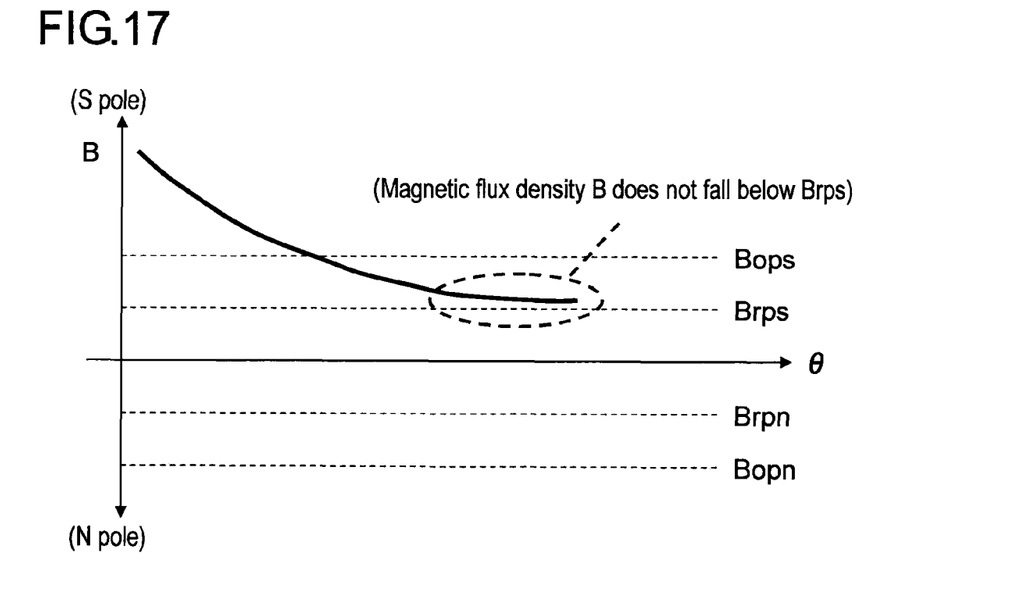
FIG. 17 is an explanatory diagram related to the magnetic-field offset phenomenon.

If, in the folding-type device mentioned above, another magnetic body (e.g., a speaker) is arranged near the magnetic sensor (for example, at position 156 shown in FIG. 14), the relationship between the magnetic flux density B detected by the magnetic sensor 153 and the angle θ may be, for example, as shown in FIG. 17. Specifically, due to the influence of another magnetic body, an offset occurs in the magnetic flux density B, and thus, even when the angle θ is sufficiently great, a phenomenon may occur in which the magnetic flux density B does not fall below Brps (hereinafter, such a phenomenon will be referred to as the "magnetic-field offset phenomenon" for the sake of convenience).

When the magnetic-field offset phenomenon occurs, the output signal may not transit to the H level although the angle θ is sufficiently great. As a result, in the electronic device 150, there arises an inconvenience that the deformed state (in particular, a change from the closed state to the open state) cannot be detected correctly.

In the sliding-type device, it seems that if the distance d is properly set, the reverse magnetic field phenomenon could be avoided. In the folding-type device, it seems that if the influence of another magnetic body does not act on the magnetic sensor, the magnetic-field offset phenomenon could be avoided.

However, when such phenomena are found at a stage where specifications of the electronic device body have been determined to a certain extent, in order to eliminate the phenomena, a correction etc. of the distance d or the speaker position is generally required. Such a correction often involves a major revision etc. of specifications of the electronic device body, and thus is preferably avoided as much as possible. Moreover, due to design limitations of the electronic device body, a situation may occur in which the distance d must be reduced or another magnetic body must be arranged near the magnetic sensor.

SUMMARY OF THE INVENTION

In view of the disadvantages mentioned above, an object of the present invention is to provide a magnetic sensor that can solve, as simple as possible, inconveniences due to a reverse magnetic field phenomenon or magnetic-field offset phenomenon.

To achieve the above object, according to the invention, a magnetic sensor comprises: a detector detecting intensity of magnetic field; a comparison portion comparing a result of the detection with a set threshold value and outputting an output signal corresponding to a result of the comparison; and a threshold-value adjuster adjusting the threshold value.

With this configuration, since the threshold-value adjuster is provided, it is possible to adjust a threshold value (corresponding to operation magnetic flux density or return magnetic flux density described later) used for comparison with the result of the detection. Thus, even when an inconvenience occurs due to the reverse magnetic field phenomenon or magnetic-field offset phenomenon, by a method such as adjusting the threshold value, it is possible to solve the inconvenience as simple as possible.

In the configuration described above, preferably, the detector performs the detection at both an S-pole side and an N-pole side; the comparison portion compares the result of the detection at the S-pole side with an S-pole-side threshold value set as the threshold value at the S-pole side and compares the result of the detection at the N-pole side with an N-pole-side threshold value set as the threshold value at the N-pole side; and the threshold-value adjuster, on adjusting the threshold value, changes both the N-pole-side threshold value and the S-pole-side threshold value by an equal value.

With this configuration, since the intensity of magnetic field can be detected at both poles, it is possible to properly detect the open/closed state of an electronic device irrespective of the fitting direction of a magnet. On adjustment of the threshold value, since both the N-pole-side threshold value and S-pole-side threshold value are changed by an equal value, it is possible, even after the adjustment has been done, to properly perform detection at both poles.

In the configuration described above, preferably, the threshold value is set, depending on the state of the output signal, to either of a first threshold value and a second threshold value having different values from one another.

With this configuration, since the threshold value, which is used for comparison with the result of the detection, is provided with hysteresis, it is possible to suppress, as much as possible, the output signal from becoming unstable.

In the configuration described above, preferably, the threshold-value adjuster, on adjusting the threshold value, can adjust one of the first and second threshold values without changing another.

With this configuration, even when one of the first and second threshold values is not to be changed, it is possible to adjust the threshold value by changing another alone.

In the configuration described above, preferably, the first threshold value is a value corresponding to operation magnetic flux density, and the second threshold value is a value corresponding to return magnetic flux density.

In the configuration described above, preferably, each of the first and second threshold values comprises information of two values of different polarities.

In the configuration described above, preferably, a signal input portion receiving an input of a control signal related to control of the threshold value is comprised, and the threshold-value adjuster adjusts the threshold value in response to the control signal.

With an electronic device comprising the magnetic sensor configured as described above, it is possible to enjoy advantages associated with the configuration described above. Thus, detection of a deformed state etc. of the electronic device can be performed more properly.

BRIEF DESCRIPTION OF THE DRAWINGS

This and other objects and features of the present invention will become clear from the following description, taken in conjunction with a preferred embodiment with reference to the accompanying drawings.

DETAILED DESCRIPTION OF PREFERRED EMBODIMENTS

Figure 1:
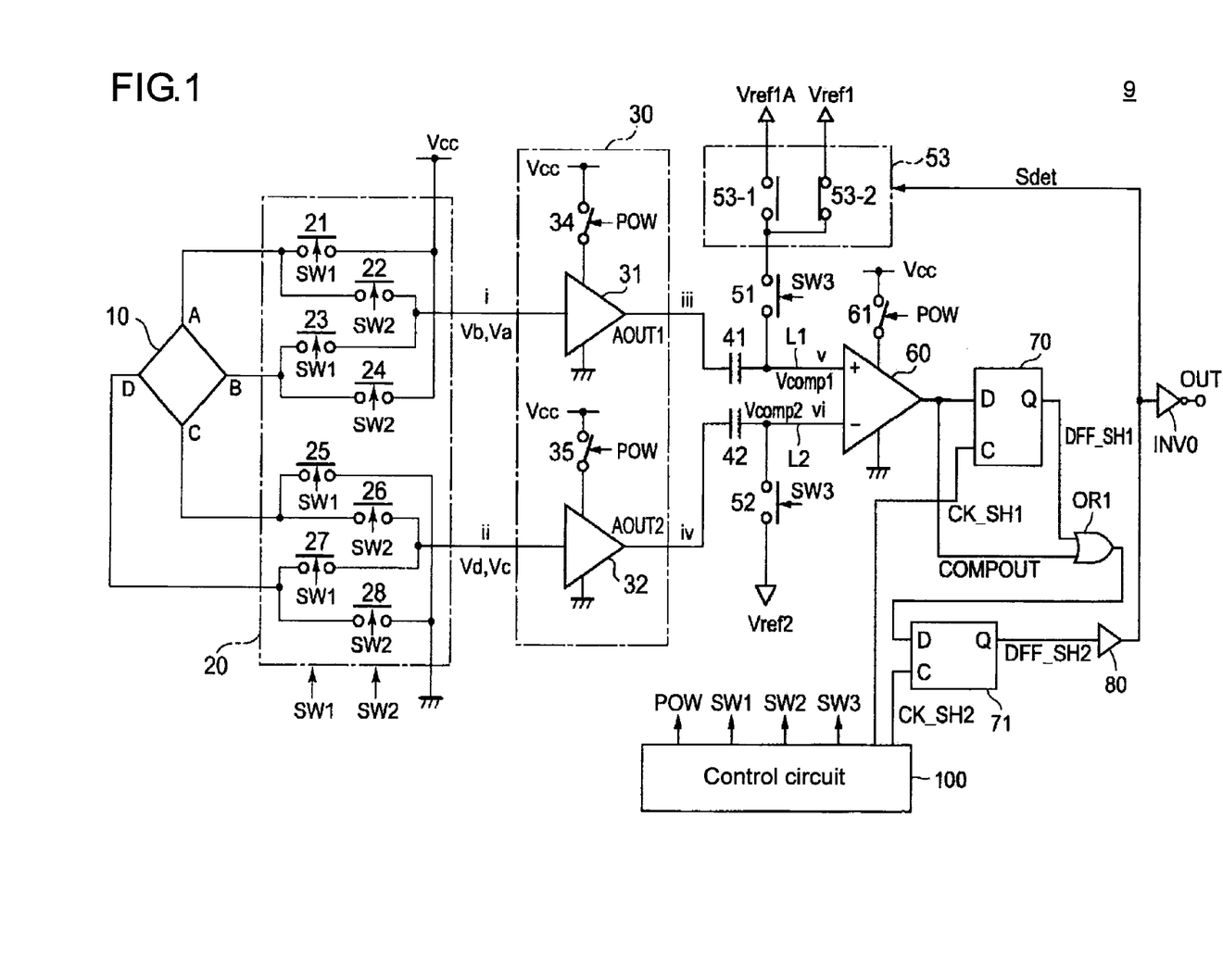
FIG. 1 is a configuration diagram of a magnetic sensor according to an embodiment of the present invention.

An embodiment of the present invention will be described below with reference to the relevant drawings. FIG. 1 is a configuration diagram of a magnetic sensor 9 according to the embodiment. The magnetic sensor 9 is basically equivalent to a magnetic sensor 1A disclosed in JP-A-2008-32424 as a "second practical example", except for the configurations etc. of an amplifier unit 30 and a reference-voltage generation circuit 90.

As shown in FIG. 1, the magnetic sensor 9 is provided with a Hall element 10, a switching switch circuit 20, an amplifier unit 30, a first and second capacitors (41 and 42), a first and second switch circuits (51 and 52), a reference-voltage switching circuit 53, a comparison unit 60, a switch circuit 61, latch circuits (70 and 71), a buffer amplifier 80, a control circuit 100, an OR circuit OR1, an inverter INV0, etc.

The magnetic sensor 9 may be formed as an IC chip; in this case, there are also provided a terminal for receiving source supply from outside (from an electronic device body that incorporates the magnetic sensor 9), a ground terminal, and the like. The magnetic sensor 9 is provided in electronic devices that can be deformed, such as the sliding-type device (see FIG. 12), the folding-type device (see FIG. 14), and the like mentioned earlier, as a sensor for detecting the deformed state.

The Hall element 10 is formed into a plate with a shape geometrically equivalent with respect to four terminals A, C, B, and D.

In such a Hall element 10, when a comparison is made between a Hall voltage generated between a second terminal pair B-D when a source voltage Vcc is applied to a first terminal pair A-C and a Hall voltage generated between the first terminal pair C-A when the source voltage Vcc is applied to the second terminal pair B-D, an effective signal component corresponding to the intensity of the magnetic field applied to the Hall element 10 is in phase and an element offset component (an element offset voltage) is in opposite phase.

The switching switch circuit 20 switches the way the source voltage Vcc is applied to the Hall element 10 and the way the Hall voltage is taken out from the Hall element 10.

More specifically, the switching switch circuit 20 has switches 21, 23, 25, and 27, which turn on in response to a first switching signal SW1, and switches 22, 24, 26, and 28, which turn on in response to a second switching signal SW2. The first and second switching signals SW1 and SW2 are generated such that they do not overlap with each other and that a first switching signal SW1 is generated in a first half part of a predetermined period in which a power-supply-on signal POW is generated and a second switching signal SW2 is generated in a latter half part of the predetermined period. The power-supply-on signal POW is generated intermittently, for example, at a fixed cycle for a predetermined period.

In a first switching state in which the first switching signal SW1 is generated, terminal A has the source voltage Vcc applied thereto, terminal C is connected to the ground, and a Hall voltage corresponding to the intensity of magnetic field is generated between terminal B and terminal D. With respect to the voltage between terminals B and D, though it depends on the direction in which the magnetic field is applied, it is assumed here that a voltage Vb at terminal B is low, and a voltage Vd at terminal D is high. The voltage is expressed in terms of a potential relative to the ground, unless otherwise specified.

Switching from the first switching signal SW1 to the second switching signal SW2 is performed at high speed, and thus it is assumed that, also in the second switching state, the direction of the magnetic field is the same as that in the first switching state. In the second switching state where the second switching signal SW2 is generated, terminal B has the source voltage Vcc applied thereto, terminal D is connected to the ground, and a Hall voltage corresponding to the intensity of the magnetic field is generated between terminal C and terminal A. With respect to the voltage between terminals C and A, a voltage Vc at terminal C is low and a voltage Va at terminal A is high.

Thus, the voltage at a first output terminal i of the switching switch circuit 20 is the voltage Vb in the first switching state, and is the voltage Va in the second switching state. On the other hand, the voltage at a second output terminal ii of the switching switch circuit 20 is the voltage Vd in the first switching state, and is the voltage Vc in the second switching state.

The amplifier unit 30 amplifies the voltage at a first amplification input terminal, which is connected to the first output terminal i, by a first amplifier circuit 31 at a predetermined amplification degree a so as to generate a first amplification voltage at a first amplification output terminal iii. In the first amplifier circuit 31, there exists an input offset voltage Voffa1, and thus that input offset voltage Voffa1 is added to the voltage at the first amplification input terminal.

In addition, the amplifier unit 30 amplifies the voltage at a second amplification input terminal, which is connected to the second output terminal ii, by a second amplifier circuit 32 at a predetermined amplification degree a so as to generate a second amplification voltage at a second amplification output terminal iv. Also in the second amplifier circuit 32, there exists an input offset voltage Voffa2, and thus that input offset voltage Voffa2 is added to the voltage at the second amplification input terminal.

In the amplifier unit 30, the source voltage Vcc is applied to the first and second amplifier circuits 31 and 32 via a switch circuit 34 and a switch circuit 35, respectively, which are turned on by the power-supply-on signal POW. The amplifier unit 30 therefore is driven intermittently, for example, at a fixed cycle for a predetermined period in response to the power-supply-on signal POW. When the first and second amplifier circuits 31 and 32 are of a current-driven type, the switch circuits 34 and 35 may be configured with a current source circuit with a switch function.

The first capacitor 41 is connected between the first amplification output terminal iii and a first comparison input terminal v of the comparison unit 60. The second capacitor 42 is connected between the second amplification output terminal iv and a second comparison input terminal vi of the comparison unit 60.

The comparison unit 60 compares a first comparison voltage, which is fed to the first comparison input terminal v, with a second comparison voltage, which is fed to the second comparison input terminal vi, and generates a comparison output when the first comparison voltage exceeds the second comparison voltage. The comparison unit 60 is configured so as to have a very high input impedance. For example, its input circuit is configured with a MOS transistor circuit. To the comparison unit 60, a source voltage is applied via the switch circuit 61 which is turned on by the power-supply-on signal POW. The comparison unit 60 therefore is driven intermittently, for example, at a fixed cycle for a predetermined period in response to the power-supply-on signal POW. The switch circuit 61 may be a current source circuit with a switch function.

To the first comparison input terminal v, a first reference voltage Vref1 is fed via the first switch circuit 51, which is turned on by a third switching signal SW3, and the reference-voltage switching circuit 53. The reference-voltage switching circuit 53 is switched, when a magnetic sensor circuit detects magnetism, by a corresponding detection signal Sdet. When the reference-voltage switching circuit 53 is switched, the first comparison input terminal v is then fed with a corrected first reference voltage Vref1A.

To the second comparison input terminal vi, a second reference voltage Vref2 is fed via the second switch circuit 52 which is turned on by the third switching signal SW3. Preferably, the first reference voltage Vref1 is set to a value lower than the corrected first reference voltage Vref1A by a predetermined value, and the corrected first reference voltage Vref1A is set to a value lower than the second reference voltage Vref2 by a predetermined value. As the corrected first reference voltage Vref1A, the second reference voltage Vref2 can be used.

With the voltages that are fed to the first and second comparison input terminals v and vi being the first reference voltage Vref1 and the second reference voltage Vref2, respectively, when no comparison output is generated, and being the corrected first reference voltage Vref1A and the second reference voltage Vref2, respectively, when the comparison output is generated, it is possible to give a hysteresis characteristic to the operation of the comparison unit 60.

The control circuit 100 outputs the power-supply-on signal POW, the first switching signal SW1, the second switching signal SW2, the third switching signal SW3, and clock signals CK_SH1 and CK_SH2, so as to control the operation of the magnetic sensor 9. More specific description on the operation will be given later.

The latch circuit 70 latches a signal COMPOUT (comparison output), which is output from the comparison unit 60 on the rising edge of the clock signal CK_SH1. The OR circuit OR1 receives the signal COMPOUT and a signal DFF_SH1 (a first latch output) which is output from the latch circuit 70. The latch circuit 71 latches an output of the OR circuit OR1 on the rising edge of the clock signal CK_SH2. As the latch circuits 70 and 71, a D flip-flop is suitable.

The buffer amplifier 80 amplifies the signal DFF_SH2 (a second latch output), which is output from the latch circuit 71, and outputs the detection signal Sdet. The inverter INVO inverts the detection signal Sdet and outputs an output signal OUT. Information of the output signal OUT indicates whether the intensity of magnetic field is a predetermined intensity, and is transmitted to a control device etc. of the electronic device provided with the magnetic sensor 9. In this way, the electronic device can judge the deformed state of the electronic device by use of the information of the output signal OUT.

Figure 2:
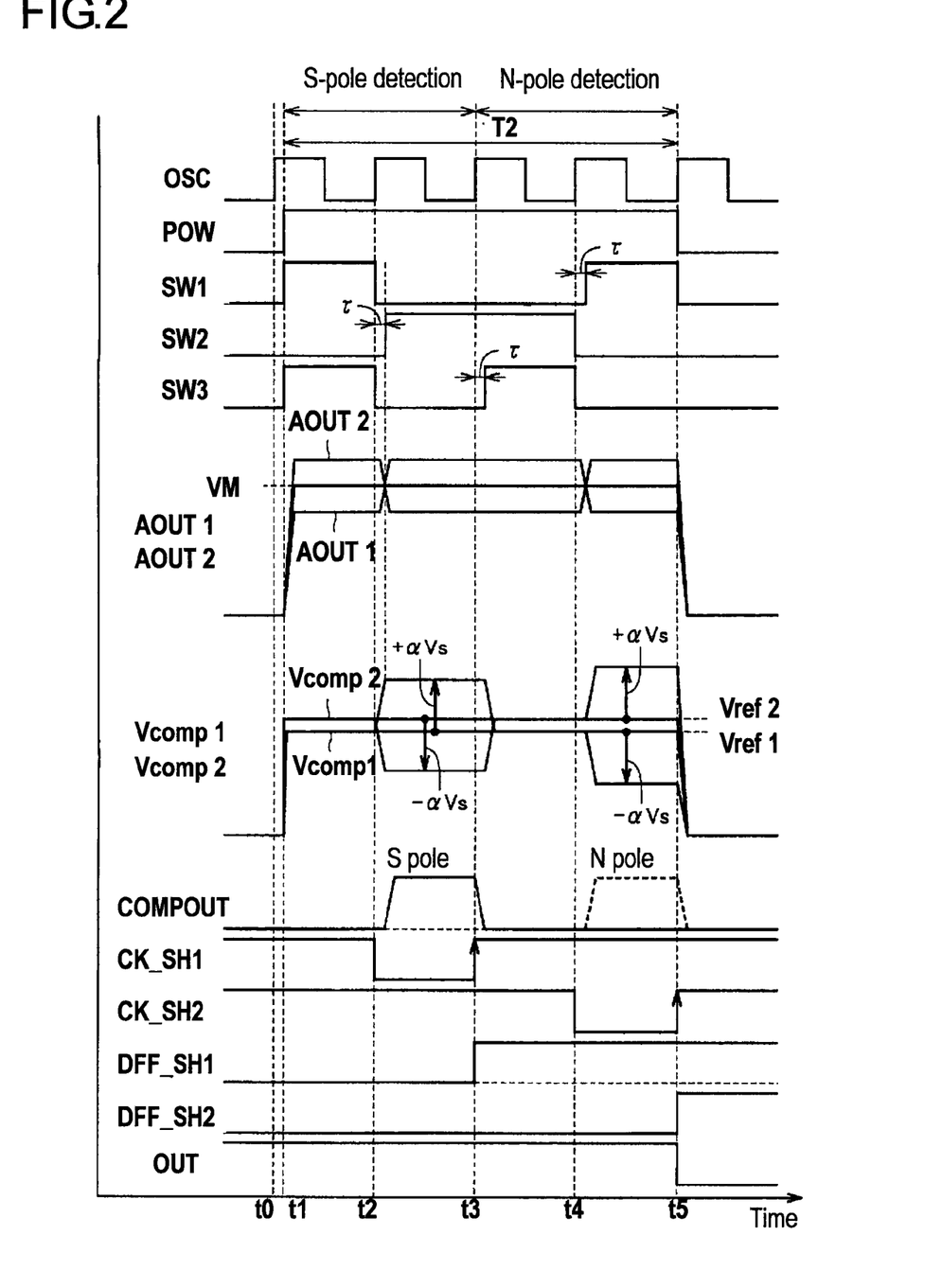
FIG. 2 is a timing chart related to the operation of the magnetic sensor.

FIG. 2 is a timing chart related to the operation of the magnetic sensor 9. In FIG. 2, a signal OSC is a signal serving as a reference for the operation of the control circuit 100, and is produced within the control circuit 100.

The power-supply-on signal POW is generated at a predetermined cycle (for example, 50 ms) for a predetermined time T2 (for example, 25 µs). As shown in FIG. 2, a period from time t1 to time t5 is the predetermined time T2. The predetermined time T2 includes a first period to a fourth period, namely the period from time t1 to time t2, the period from time t2 to time t3, the period from time t3 to time t4, and the period from time t4 to time t5.

In the following description, it is assumed that the intensity of magnetic field of the S polarity is detected in the first and second periods and that of the N polarity is detected in the third and fourth periods. It should be noted that the order of the polarity of the magnetic field to be detected may be reversed.

On rising edge of the signal OSC at time t0, at time t1 immediately thereafter, the power-supply-on signal POW is generated. At approximately the same time as the generation of the power-supply-on signal POW, the first switching signal SW1 and the third switching signal SW3 are generated. The generation of the first switching switch SW1 makes the switching switch circuit 20 be in the first switching state. The generation of the third switching signal SW3 makes both the first and second switch circuits 51 and 52 turn on.

A voltage AOUT1 and a voltage AOUT2 represent outputs of the first amplifier circuit 31 and the second amplifier circuit 32, respectively. In the period from time t1 to time t2, the voltage AOUT1 is $\alpha$ (Vb−Voffa1) and the voltage AOUT2 is $\alpha$ (Vd−Voffa2). In addition, a first comparison voltage Vcomp1 at the first comparison input terminal v of the comparison unit 60 is the first reference voltage Vref1, and a second comparison voltage Vcomp2 at the second comparison input terminal vi of the comparison unit 60 is the second reference voltage Vref2. If there is no signal from the Hall element 10, the voltages AOUT1 and AOUT2 are equal to a voltage VM shown in FIG. 2.

The control circuit 100 sets the switching switch circuit 20 such that, in the second period, the second switching state starts at a predetermined short time i after the time of completion of the first switching state (time t2). In the period from time t2 to time t3, the voltage AOUT1 is $\alpha$ (Va−Voffa1) and the voltage AOUT2 is $\alpha$ (Vc−Voffa2). As indicated by formulas 1 and 2 mentioned above, the first comparison voltage Vcomp1 is Vref1−$\alpha$ (Vb−Va), and the second comparison voltage Vcomp2 is Vref2−$\alpha$ (Vd−Vc). Let the Hall voltage (inter-terminal voltage) be Vs, then the first comparison voltage Vcomp1 is changed from Vref1 by +$\alpha$Vs, and the second comparison voltage Vcomp2 is changed from Vref2 by −$\alpha$Vs.

On rising edge of the signal OSC at time t3, at a predetermined short time $\tau$ thereafter, the third switching signal SW3 is generated again. In response to the generation of the third switching signal SW3, the first comparison voltage Vcomp1 is changed to the first reference voltage Vref1, and the second comparison voltage Vcomp2 is changed to the second reference voltage Vref2. The switching switch circuit 20 is kept in the second switching state, and thus the voltages AOUT1 and AOUT2 are kept at $\alpha$ (Va-Voffa1) and $\alpha$ (Vc-Voffa1), respectively.

The control circuit 100 sets the switching switch circuit 20 such that, in the fourth period, the first switching state starts at a predetermined short time i after the time of completion of the second switching state (time t4). Thus, the voltage AOUT1 is changed to $\alpha$ (Vb−Voffa1) and the voltage AOUT2 is changed to a (Vd−Voffa2). The first comparison voltage Vcomp1 is changed to Vref1−$\alpha$ (Va−Vb) and the second comparison voltage Vcomp2 is changed to Vref2−$\alpha$ (Vc−Vd). Thus, in the fourth period, the first comparison voltage Vcomp1 is changed from Vref1 by −$\alpha$Vs, and the second comparison voltage Vcomp2 is changed from Vref2 by +$\alpha$Vs.

If the intensity of magnetic field is equal to or more than a predetermined intensity, a signal is output from the Hall element 10, and thus a signal COMPOUT of the H level is obtained. The signal COMPOUT is at the H level in the period from time t2 to time t3 when the polarity of the magnetic field is the S-polarity and in the period from time t4 to time t5 when the polarity of the magnetic field is the N-polarity.

The clock signal CK_SH1 falls at time t2, and rises at time t3. At time t3, if the signal COMPOUT is at the H level, the signal DFF_SH1 transits from the L level to the H level.

The clock signal CK_SH2 falls at time t4, and rises at time t5. At time t5, the output of the OR circuit OR1 is at the H level, and thus the signal DFF_SH2 is changed from the L level to the H level, and the output signal OUT is changed from the H level to the L level.

On the other hand, at time t5, when the signal COMPOUT is at the H level, the output of the OR circuit OR1 is at the H level in response to the signal COMPOUT. Thus, when the clock signal CK_SH2 rises at time t5, the signal DFF_SH2 is changed from the L level to the H level, and the output signal OUT is changed from the H level to the L level.

Changing of the output signal OUT from the H level to the L level means that the intensity of the magnetic field is equal to or more than a predetermined intensity. As described above, the control circuit 100 sets the switching switch circuit 20 to be in the first switching state in the first and fourth periods and to be in the second switching state in the second and third periods. In addition, the control circuit 100 turns on the first and second switch circuits 51 and 52 in the first and third periods. Thus, independent from the direction of the magnetic field with respect to the Hall element 10, the magnetic sensor 9 can detect that the intensity of the magnetic field is equal to or more than a predetermined intensity.

Figure 3:
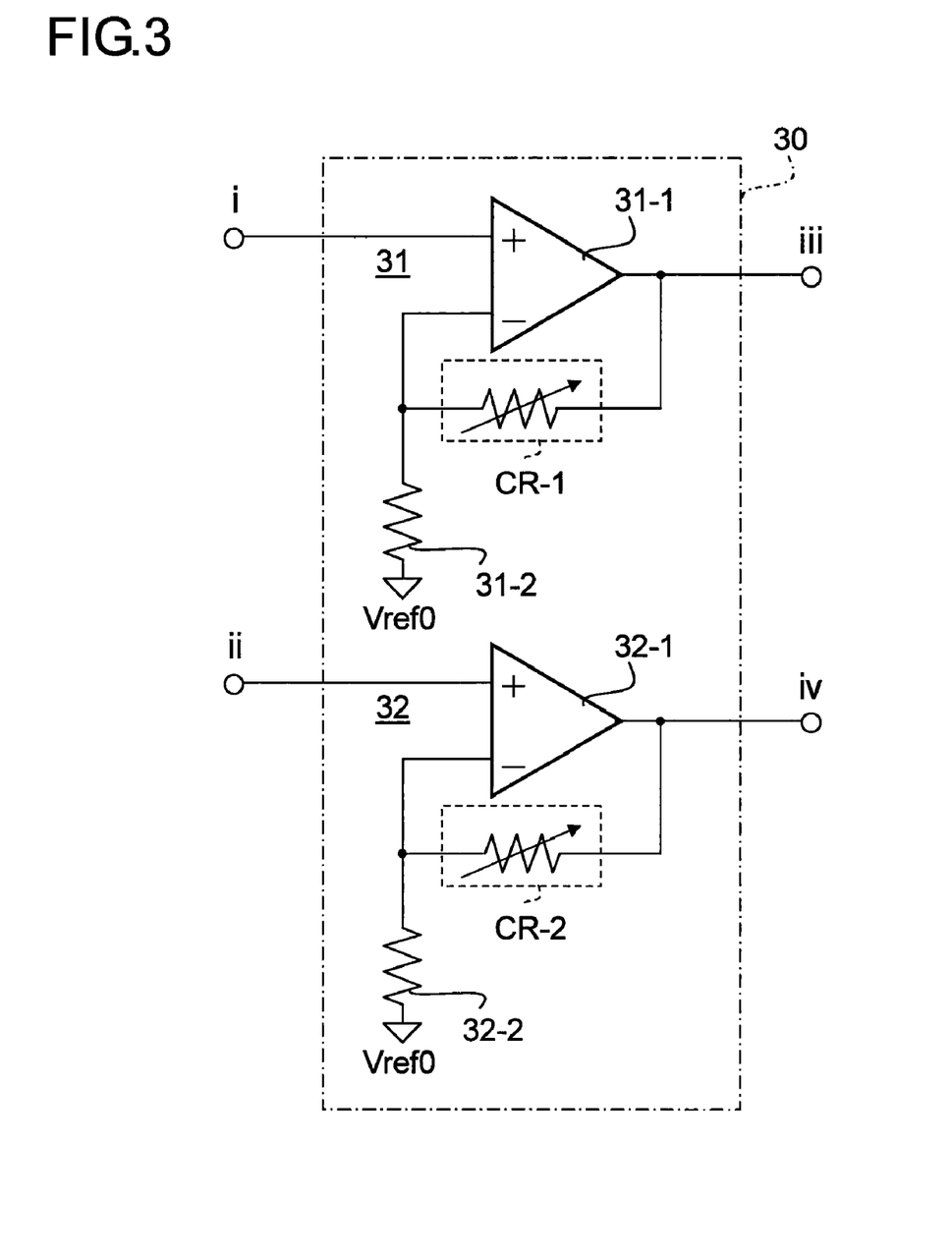
FIG. 3 is a configuration diagram of an amplifier unit provided in the magnetic sensor.

Next, a description will be given of more specific configuration of the amplifier unit 30 with reference to FIG. 3.

As mentioned earlier, the amplifier unit 30 is provided with the first amplifier circuit 31 and the second amplifier circuit 32. The first amplifier circuit 31 is provided with an operational amplifier 31-1 whose output terminal is connected to the first amplification output terminal iii and to one end of a variable resistor (specific configuration will be described later) CR-1. The other end of the variable resistor CR-1 is connected to an inverting input terminal of the operational amplifier 31-1 and to one end of a resistor 31-2. To the other end of the resistor 31-2, a reference voltage Vref0 is fed. A non-inverting input terminal of the operational amplifier 31-1 is connected to the first output terminal i.

On the other hand, the second amplifier circuit 32 is provided with an operational amplifier 32-1 whose output terminal is connected to the second amplification output terminal iv and to one end of a variable resistor CR-2. The other end of the variable resistor CR-2 is connected to an inverting input terminal of the operational amplifier 32-1 and to one end of a resistor 32-2. To the other end of the resistor 32-2, the reference voltage Vref0 is fed. A non-inverting input terminal of the operational amplifier 32-1 is connected to the second output terminal ii.

According to the configuration described above, when the resistance values of the variable resistors CR-1 and CR-2 are represented by R2 and the resistance values of the resistors 31-2 and 32-2 are represented by R1, the amplification factor $\alpha$ of the individual amplifier circuits (31 and 32) is approximately R2/R1 (here, R2>>R1). Thus, changing of the resistance value of the variable resistors CR-1 and CR-2 also renews the amplification factor $\alpha$. In order to enable changing of the amplification factor $\alpha$, the resistance values of the resistors 31-2 and 32-2 may be made changeable.

The previously-mentioned reference voltages (the first reference voltage Vref1, the corrected first reference voltage Vref1A, the second reference voltage Vref2, and the reference voltage Vref0) can be produced by a method or the like in which the voltage fed from outside is divided. A description will now be given of the configuration of a circuit (referred to as the "reference-voltage generation circuit 90") for generating the first reference voltage Vref1 and the corrected first reference voltage Vref1A with reference to FIG. 4.

Figure 4:
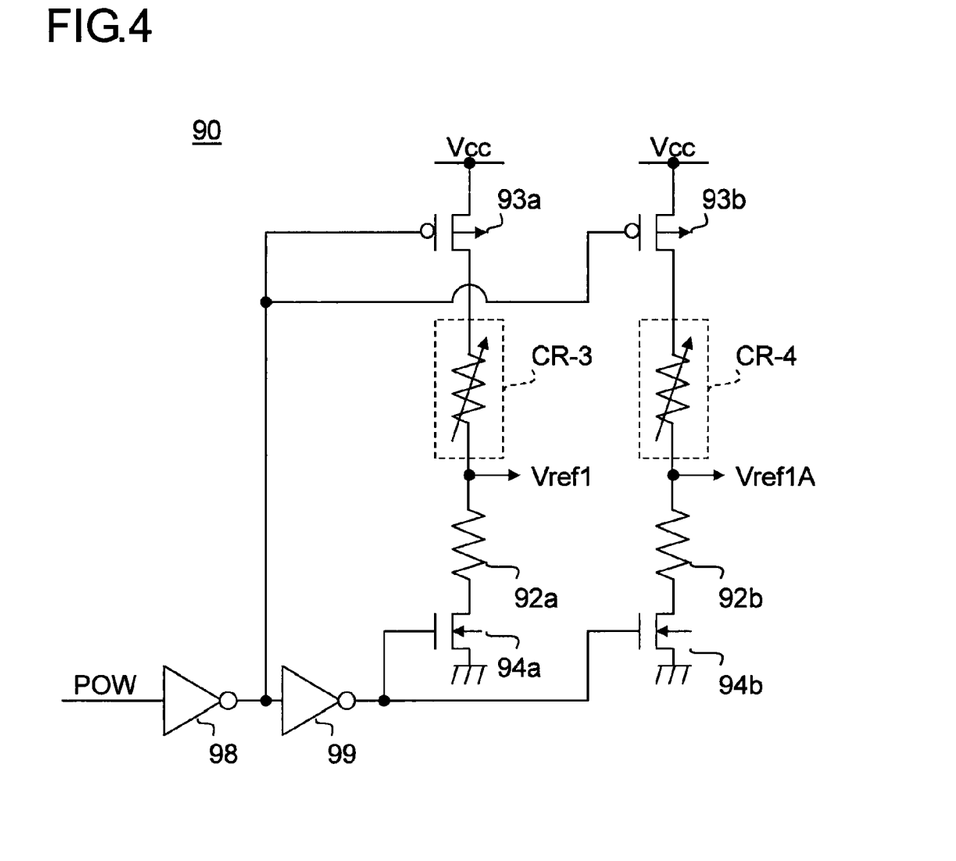
FIG. 4 is a configuration diagram of a reference-voltage generation circuit provided in the magnetic sensor.

As shown in FIG. 4, the reference-voltage generation circuit 90 divides the source voltage Vcc with different voltage-dividing resistors so as to generate the first reference voltage Vref1 and the corrected first reference voltage Vref1A. More specifically, as the voltage-dividing resistor for generating the first reference voltage Vref1, a variable resistor CR-3 and a resistor 92a are connected in series, and as the voltage-dividing resistor for generating the corrected first reference voltage Vref1A, a variable resistor CR-4 and a resistor 92b are connected in series.

These reference voltages are generated when p-type MOS transistors (93a and 93b) whose one ends are fed with the source voltage Vcc and n-type MOS transistors (94a and 94b) whose one ends are grounded, are ON. To the gates of the MOS transistors (93a and 93b), the power-supply-on signal POW is fed via an inverter 98. To the gates of the MOS transistors (94a and 94b), the power-supply-on signal POW is fed via the inverter 98 and an inverter 99. Thus, the ON/OFF state of each MOS transistor is switched in response to the power-supply-on signal POW.

According to the configuration described above, changing of the resistance value of the variable resistor CR-3 renews the first reference voltage Vref1. In addition, changing of the resistance value of the variable resistor CR-4 renews the corrected first reference voltage Vref1A.

Next, a description will be given of a specific configuration of the above-mentioned variable resistors (CR-1 to CR-4, hereinafter collectively referred to as the "variable resistor CR") with reference to FIGS. 5 and 6.

Figure 5:
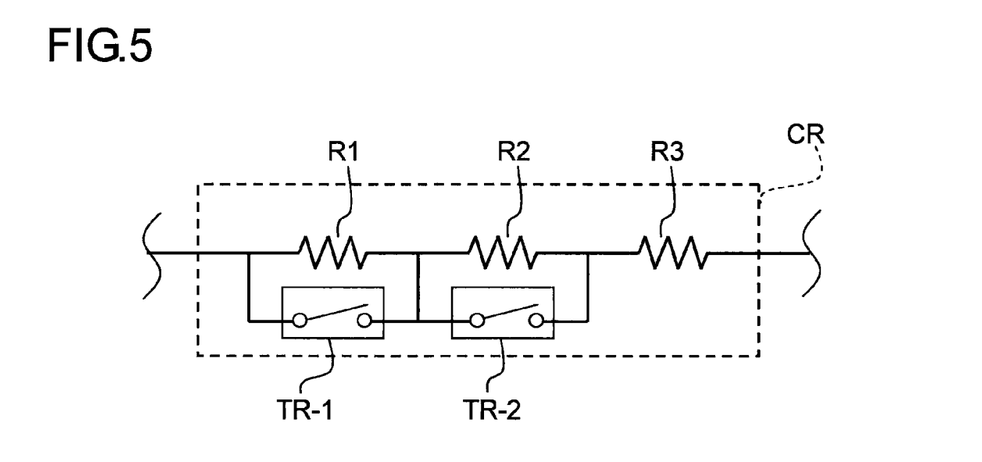
FIG. 5 is a configuration diagram of a variable resistor provided in the magnetic sensor.
Figure 6:
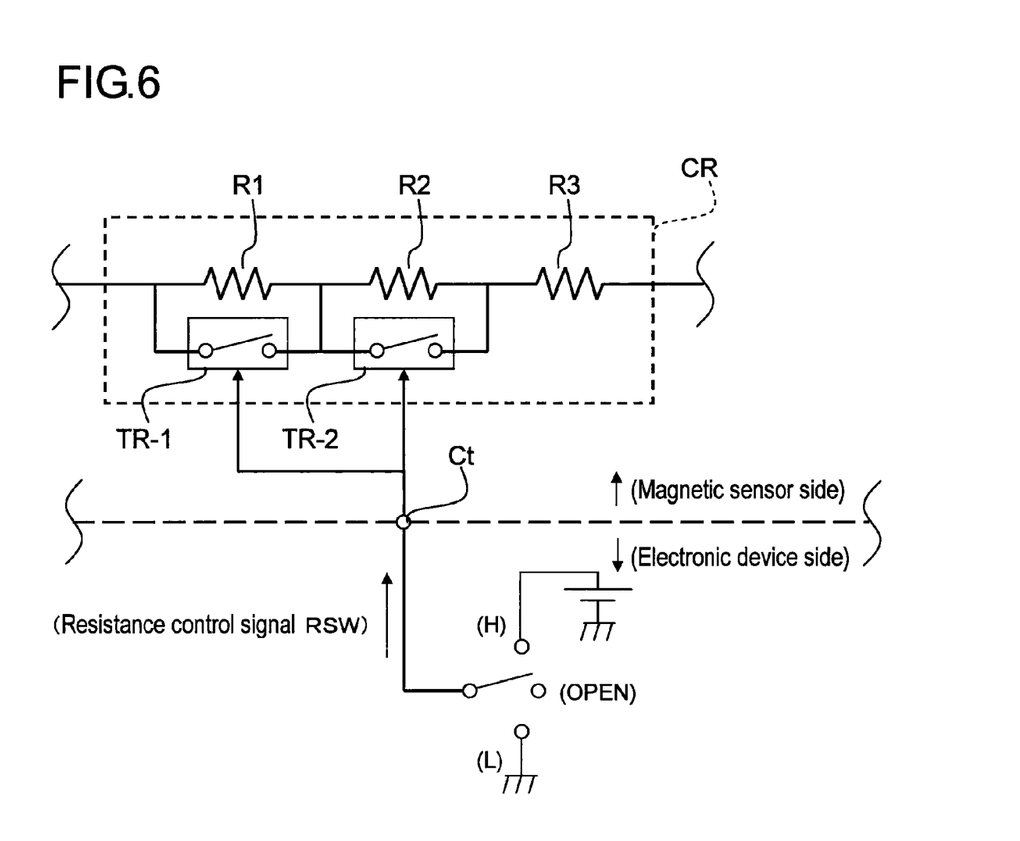
FIG. 6 is another configuration diagram of the variable resistor provided in the magnetic sensor.

As shown in FIG. 5, opposite ends of the variable resistor CR are connected via a circuit in which a resistor R1, a resistor R2, and a resistor R3 are connected in series. Furthermore, the resistor R1 has one end and another end thereof connected to, so as to be in parallel with, a conduction adjuster TR-1, and the resistor 2 has one end and another end thereof connected to, so as to be in parallel with, a conduction adjuster TR-2.

Conduction state (conducting or non-conducting) of these conduction adjusters (TR-1 and TR-2) can be set arbitrarily during or after the manufacturing process of the magnetic sensor 9. For example, in a magnetic sensor 9 having each circuit formed by a printed circuit board, the conduction adjusters (TR-1 and TR-2) can adjust the conduction state (adjustment from a conducting state to a non-conducting state) by trimming. The conduction adjusters (TR-1 and TR-2) may be so formed that the conduction state can be adjusted depending on with or without soldering etc.

The variable resistor CR may be so formed that adjustment of the resistance value is possible in a state where the magnetic sensor 9 is incorporated in the electronic device. For example, as shown in FIG. 6, the magnetic sensor 9 may be provided with an input terminal Ct for a resistance control signal RSW related to the resistance-value control of the variable resistor CR, and, depending on the state of the resistance control signal RSW, the conduction state of the conduction adjusters (TR-1 and TR-2) may be adjusted.

In this case, due to control operation or the like at the electronic device side, the input terminal Ct is set to any one of H, L, and OPEN (high impedance) states. Thus, the magnetic sensor 9 has the resistance control signal RSW fed from the electronic device. Changing of the state of the resistance control signal RSW also changes the resistance value of the variable resistor CR. In the electronic device, the state of the resistance control signal RSW may be made switchable through a predetermined operation or the like.

It should be understood that the embodiment of the variable resistor CR is merely an example; it is also possible to adopt other configuration such as one with the number of resistors or conduction adjusters increased. With respect to the resistance value of the variable resistor CR, in terms of what value it can be changed to, how many levels it can be changed to (or if it can be changed in an analog manner), etc. can be achieved in different manners.

From a functional viewpoint, it can be said that the magnetic sensor 9 described above has a configuration shown in FIG. 7. That is, the magnetic sensor 9 is provided with a detector 1, a comparison portion 2, a threshold-value adjuster 3, etc.

Figure 7:
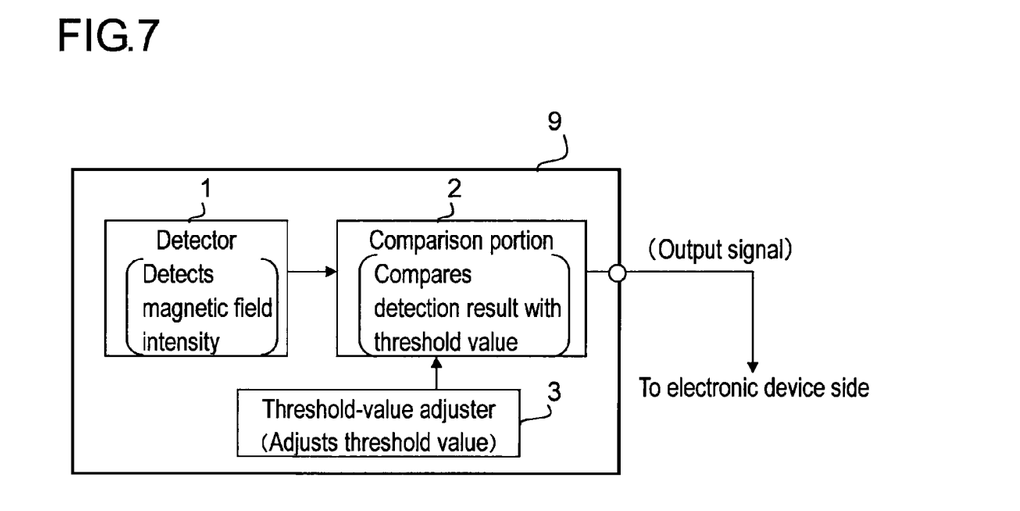
FIG. 7 is a configuration diagram of the magnetic sensor as seen from a functional viewpoint.

The detector 1 is realized with the ealier-mentioned Hall element 10 etc., and is a functional block for detecting the intensity of magnetic field (the magnetic flux density B). In addition, the detector 1 can detect the intensity of the magnetic field at both poles (can detect in either S-pole or N-pole direction).

The comparison portion 2 is realized with the earlier-mentioned comparison unit 60 etc., and is a functional block for comparing the intensity of magnetic field detected by the detector 1 with a previously set threshold value. As the threshold value, for the S-pole side, there are set a threshold value ("the operation magnetic flux density at the S-pole side: Bops"), which is adopted under a condition in which the output signal is at the H level, and a threshold value ("the return magnetic flux density at the S-pole side: Brps"), which is adopted under a condition in which the output signal is at the L level; for the N-pole side, there are set a threshold value ("the operation magnetic flux density at the N-pole side: Bopn"), which is adopted under a condition in which the output signal is at the H level, and a threshold value ("the return magnetic flux density at the N-pole side: Brpn"), which is adopted under a condition in which the output signal is at the L level.

The comparison portion 2 outputs to outside the output signal corresponding to the result of the comparison. More specifically, in a state where the magnetic flux density B is sufficiently small, the output signal of the H level is output. From this state, when the magnetic flux density B increases in the S-pole direction and exceeds Bops, the output signal transits to the L level. Thereafter, when the magnetic flux density B decreases and falls below Brps, the output signal transits to the H level. Likewise, when the magnetic flux density B increases in the N-pole direction and exceeds Bopn, the output signal transits to the L level. Thereafter, when the magnetic flux density B decreases and falls below Brpn, the output signal transits to the H level.

Bops and Bopn, though their polarities are opposite from one another, have an equal value. Likewise, Brps and Brpn, though their polarities are opposite from one another, have an equal value. Thus, these threshold values are symmetrical on the S-pole side and the N-pole side, and for this reason, the magnetic sensor 9 can properly detect the intensity of the magnetic field at both poles.

The operation magnetic flux density (Bops, Bopn) and the return magnetic flux density (Brps, Brpn) can be set to different values from one another. Thus, hysteresis can be provided between them, and it is thus possible to avoid, as much as possible, chattering (the magnetic flux density B drifts near the threshold value and thereby the output signal becomes unstable) and the like.

The threshold-value adjuster 3 is realized with the above-mentioned variable resistor CR etc., and is a functional block for adjusting the above-mentioned threshold values (the operation magnetic flux density and the return magnetic flux density). Adjustment of the threshold values are realized through adjustment of the resistance value of the variable resistor CR.

More specifically, when the resistance values of the variable resistors CR-1 and CR-2 are adjusted, the amplification factor $\alpha$ in the amplifier unit 30 is adjusted, and thereby the operation magnetic flux density (Bops, Bopn) and the return magnetic flux density (Brps, Brpn) are adjusted.

When the resistance value of the variable resistor CR-3 is adjusted, the first reference voltage Vref1 is adjusted, and thereby the operation magnetic flux density (Bops, Bopn) are adjusted. In addition, when the resistance value of the variable resistor CR-4 is adjusted, the corrected first reference voltage Vref1A is adjusted, and thereby the return magnetic flux density (Brps, Brpn) is adjusted.

Thus, with the resistance value of the variable resistor CR-3 alone being adjusted, the operation magnetic flux density (Bops, Bopn) can be adjusted without the return magnetic flux density (Brps, Brpn) being changed. In addition, with the resistance value of the variable resistor CR-4 alone being adjusted, the retun magnetic flux density (Brps, Brpn) can be adjusted without the operation magnetic flux density (Bops, Bopn) being changed.

Irrespective of how the resistance value of the variable resistor CR is adjusted, the threshold value (Bops, Brps) at the S-pole side and the threshold value (Bopn, Brpn) at the N-pole side are changed by an equal value. Thus, symmetry of the threshold values on the S-pole side and the N-pole side is maintained, and after the adjustment, detection at both poles is properly performed. With respect to the method for adjusting the threshold value, any method other than one mentioned above can be adopted.

As described above, in the magnetic sensor 9, the operation magnetic flux density (Bops, Bopn) and the return magnetic flux density (Brps, Brpn) can be changed via the threshold adjuster 3. Thus, when the reverse magnetic field phenomenon or the magnetic-field offset phenomenon occurs or is expected to occur, it is possible to take an action as described below.

First, a case is assumed where the relationship between the magnetic flux density B detected by the detector 1 and the operation magnetic flux and return magnetic flux densities is, as is, as shown in FIG. 16. Specifically, since the magnetic flux density B may exceed Bopn due to the reverse magnetic field phenomenon, a case is assumed where the state transition of the output signal occurs with unintended timing (hence where such state transition of the output signal with unintended timing is to be prevented).

Figure 8:
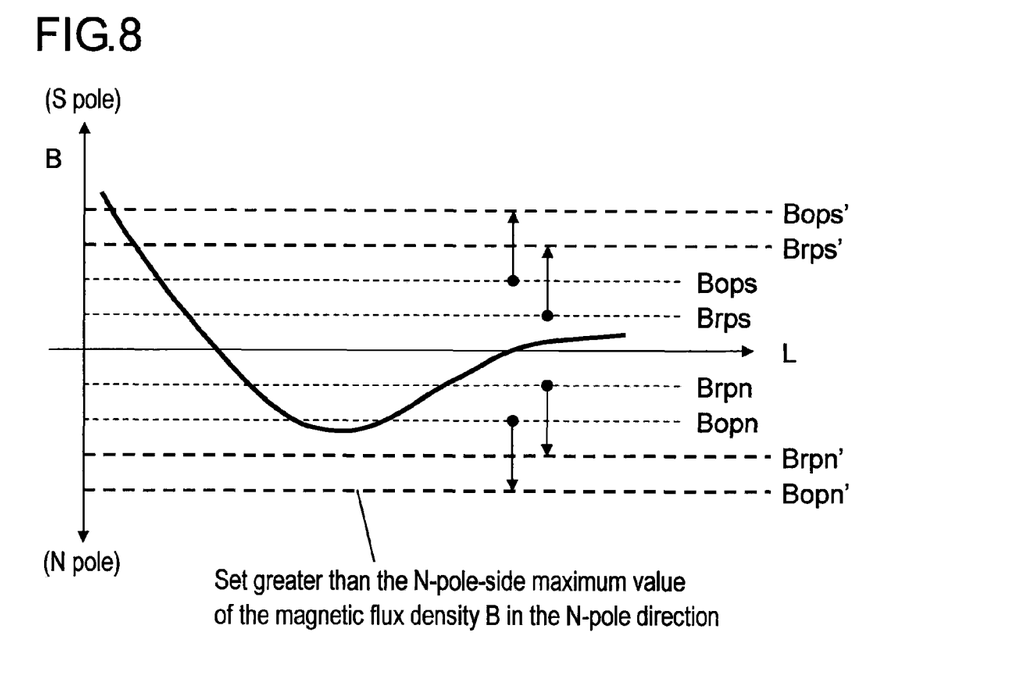
FIG. 8 is an explanatory diagram related to an action taken against a reverse magnetic field phenomenon.

In this case, preferably, the operation magnetic flux density and the return magnetic flux density are so adjusted that they are as shown in FIG. 8 (so that Bops, Bopn, Brps, and Brpn are Bops', Bopn', Brps', and Brpn', respectively). That is, preferably, Bopn is adjusted (the sensitivity is decreased) so as to be greater than the N-pole-side maximum value of the magnetic flux density B at least. This makes it possible to prevent the state transition of the output signal with unintended timing.

Figure 9:
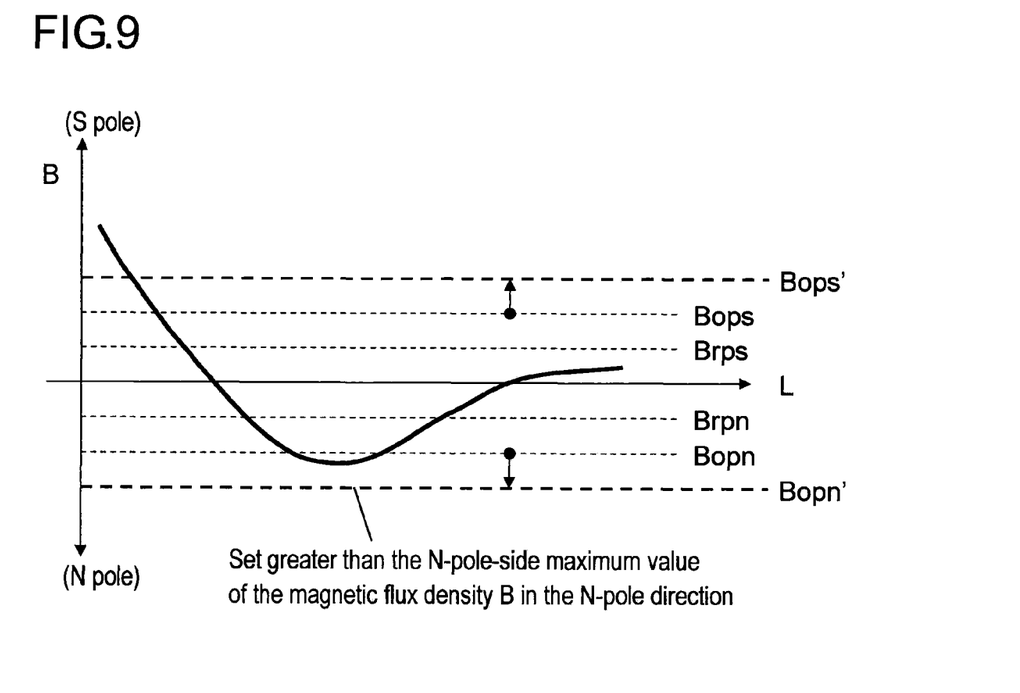
FIG. 9 is an explanatory diagram related to another action taken against the reverse magnetic field phenomenon.

As shown in FIG. 9, without the return magnetic flux density being changed, the operation magnetic flux density (Bops, Bopn) alone may be adjusted so that Bopn is greater than the S-pole-side maximum value of the magnetic flux density B. Thus, it is possible to take an appropriate action also by increasing the hysteresis of the return magnetic flux density and the operation magnetic flux density without the return magnetic flux density being changed. The action according to this method is effective particularly in a case where the return magnetic flux density is difficult to be changed for the sake of design convenience etc.

Next, a case is assumed where the relationship between the magnetic flux density B detected by the detector 1 and the operation magnetic flux and return magnetic flux densities is, as is, as shown in FIG. 17. Specifically, a case is assumed where, due to the magnetic-field offset phenomenon, the magnetic flux density B does not fall below Brps even though the angle $\theta$ is sufficiently great, and thus the open/closed state of the electronic device is not detected correctly (hence where the magnetic flux density B is made to fall below Brps when the angle θ is sufficiently great).

Figure 10:
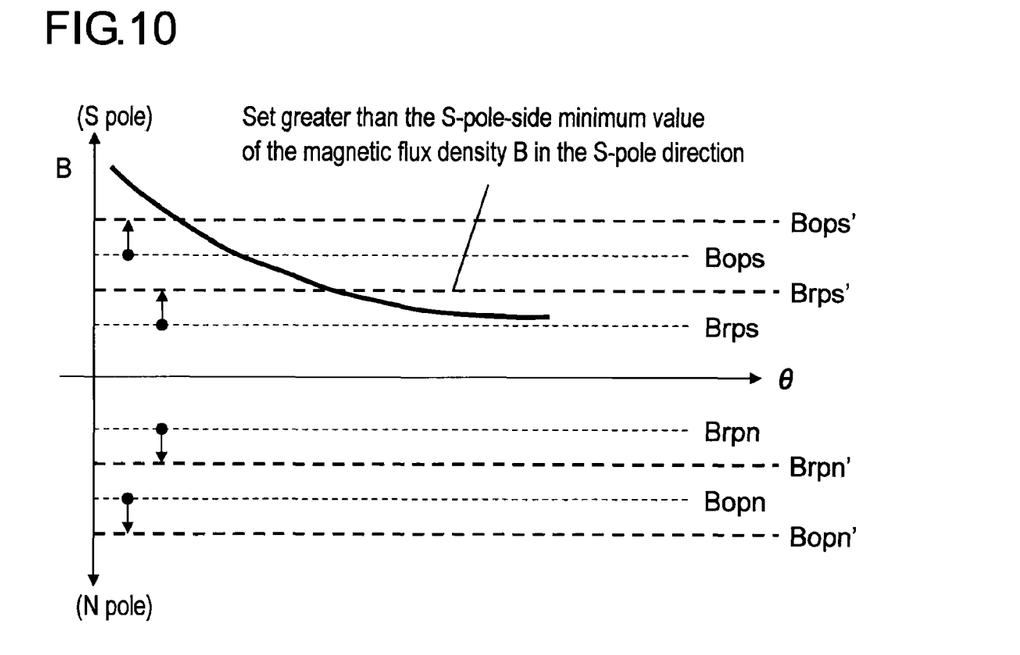
FIG. 10 is an explanatory diagram related to an action taken against a magnetic-field offset phenomenon.

In this case, preferably, the operation magnetic flux density and the return magnetic flux density are so adjusted that they are as shown in FIG. 10 (so that Bops, Bopn, Brps, and Brpn are Bops', Bopn', Brps', and Brpn', respectively). That is, preferably, Brps is adjusted (the sensitivity is decreased) so as to be greater than the S-pole-side minimum value of the magnetic flux density B at least. This makes it possible to prevent the magnetic flux density B from not falling below Brps even though the angle θ is sufficiently great.

Figure 11:
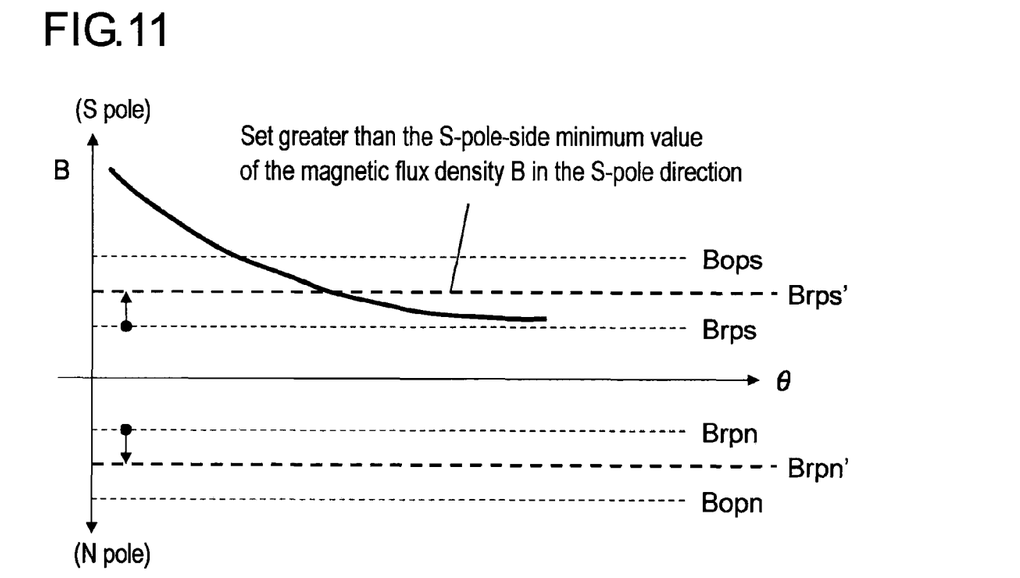
FIG. 11 is an explanatory diagram related to another action taken against the magnetic-field offset phenomenon.

As shown in FIG. 11, without the operation magnetic flux density being changed, the return magnetic flux density (Brps, Brpn) alone may be adjusted so that Brps is greater than the N-pole-side minimum value of the magnetic flux density B. Thus, it is possible to take an appropriate action also by decreasing the hysteresis of the return magnetic flux density and the operation magnetic flux density without the operation magnetic flux density being changed. The action according to this method is effective particularly in a case where the operation magnetic flux density is difficult to be changed for the sake of design convenience etc.

In a case (see FIG. 6) where the resistance value of the variable resistor CR is determined by the state of the resistance control signal RSW as mentioned above, any actions mentioned above may be made selectable through setting of the resistance control signal RSW. For example, when the resistance control signal RSW (the state at the input terminal Ct) is set to the OPEN state, the operation magnetic flux density and the return magnetic flux density may both be increased by a predetermined value; when the resistance control signal RSW is set to the H state, without the return magnetic flux density being changed, the operation magnetic flux density alone may be increased by a predetermined value; and when the resistance control signal RSW is set to the L state, without the operation magnetic flux density being changed, the return magnetic flux density alone may be increased by a predetermined value. The resistance control signal RSW is a signal related to the control of the operation magnetic flux density and the return magnetic flux density (threshold values), and it can be said that, in response to the resistance control signal RSW, the threshold values are adjusted.

The magnetic sensor 9 can be provided in any type of electronic device and can be utilized as a sensor for detecting a deformed state. For example, detection of opening/closing or sliding of cellular telephones, opening/closing of a panel of a notebook personal computer, sliding of a lens cover of digital still cameras, opening/closing of a liquid crystal display panel of camcorders, opening/closing or sliding of a door of refrigerators, etc. is possible by the magnetic sensor 9.

As described above, in addition to the detector 1 that detects the intensity of the magnetic field and the comparison portion 2 that compares the result of the detection with a currently set threshold value and outputs an output signal corresponding to the result of the comparison, the magnetic sensor 9 is provided with the threshold-value adjuster 3 that adjusts the threshold value. Thus, even when an inconvenience occurs due to the reverse magnetic field phenomenon or the magnetic-field offset phenomenon, by a method such as adjusting the threshold value, it is possible to solve the inconvenience as simple as possible.

Specifically, when such an inconvenience occurs (or is expected to occur) in the electronic device, by properly adjusting the threshold value, it is possible, on one hand, to minimize, as much as possible, the specification change etc. at the electronic device side and, on the other hand, to solve the inconvenience. Moreover, by replacing the magnetic sensor currently adopted (or to be adopted) in the electronic device with another magnetic sensor in which the threshold value is properly adjusted, it is possible, on one hand, to minimize, as much as possible, the specification change etc. at the electronic device side and, on the other hand, to solve the inconvenience.

It is to be understood that the present invention may be carried out in any other manner than specifically described above as an embodiment, and many modifications and variations are possible within the scope of the present invention.

With the magnetic sensor according to the present invention, since the threshold-value adjuster is provided, it is possible to adjust the threshold value used for comparison with the result of the detection. Thus, even when inconveniences occur due to the reverse magnetic field phenomenon or the magnetic-field offset phenomenon, it is possible to solve the inconvenience as simple as possible by a method such as adjusting the threshold value.

What is claimed is:

1. A magnetic sensor that detects intensity of a magnetic field and compares a result of the detection with a set threshold value to provide an output signal according to the result of the comparison, the magnetic sensor comprising:
    a threshold-value adjuster adapted to adjust the threshold value;
    a magnetoelectric conversion element adapted to produce across a first pair of terminals or across a second pair of terminals an output voltage according to magnetism applied thereto;
    a switch circuit adapted to be switched between a first switching state in which the switch circuit applies a source voltage across the first pair of terminals and outputs the output voltage appearing across the second pair of terminals between first and second output terminals and a second switching state in which the switch circuit applies the source voltage across the second pair of terminals and outputs the output voltage appearing across the first pair of terminals between the first and second output terminals;
    an amplifier unit adapted to output to a first amplification output terminal a first amplification voltage obtained by amplifying at a predetermined amplification factor the voltage at the first output terminal received at a first amplification input terminal and to output to a second amplification output terminal a second amplification voltage obtained by amplifying at the predetermined amplification factor the voltage at the second output terminal received at a second amplification input terminal;
    a comparison unit adapted to compare a first comparison voltage fed to a first comparison input terminal with a second comparison voltage fed to a second comparison input terminal and to produce a comparison output when the first comparison voltage is higher than the second comparison voltage;
    a first switch circuit adapted to apply a first reference voltage or a corrected first reference voltage to the first comparison input terminal when the switch circuit is in the first switching state; and
    a second switch circuit adapted to apply a second reference voltage to the second comparison input terminal when the switch circuit is in the first switching state, wherein the amplifier unit includes:
        a first amplifier circuit having a first operational amplifier, a first variable resistor, and a first resistor; and a second amplifier circuit having a second operational amplifier, a second variable resistor, and a second resistor, an output terminal of the first operational amplifier is connected to the first amplification output terminal and to one end of the first variable resistor, another end of the first variable resistor is connected to an inverting input terminal of the first operational amplifier and to one end of the first resistor, a third reference voltage is fed to another end of the first resistor, a non-inverting input terminal of the first operational amplifier is connected to the first output terminal, an output terminal of the second operational amplifier is connected to the second amplification output terminal and to one end of the second variable resistor, another end of the second variable resistor is connected to an inverting input terminal of the second operational amplifier and to one end of the second resistor, the third reference voltage is fed to another end of the second resistor, a non-inverting input terminal of the second operational amplifier is connected to the second output terminal, and the threshold value adjuster includes the first and second variable resistors.

2. The magnetic sensor according to claim 1, wherein
the detector performs the detection at both an S-pole side and an N-pole side,
the comparison portion compares a result of the detection at the S-pole side with an S-pole-side threshold value set as the threshold value at the S-pole side, and compares a result of the detection at the N-pole side with an N-pole-side threshold value set as the threshold value at the N-pole side, and
the threshold-value adjuster, on adjusting the threshold value, changes both the N-pole-side threshold value and the S-pole-side threshold value by an equal value.

3. The magnetic sensor according to claim 1, wherein the threshold value is set, depending on a state of the output signal, to either of a first threshold value and a second threshold value having different values from one another.

4. The magnetic sensor according to claim 3, wherein the first threshold value is a value corresponding to operation magnetic flux density, and the second threshold value is a value corresponding to return magnetic flux density.

5. The magnetic sensor according to claim 4, wherein each of the first and second threshold values comprises information of two values of different polarities.

6. The magnetic sensor according to claim 3, wherein the threshold-value adjuster, on adjusting the threshold value, can adjust one of the first and second threshold values without changing another.

7. The magnetic sensor according to claim 6, wherein the first threshold value is a value corresponding to operation magnetic flux density, and the second threshold value is a value corresponding to return magnetic flux density.

8. The magnetic sensor according to claim 7, wherein each of the first and second threshold values comprises information of two values of different polarities.

9. The magnetic sensor according to claim 1, further comprising:
a signal input portion receiving an input of a control signal related to control of the threshold value,
wherein the threshold-value adjuster adjusts the threshold value in response to the control signal.

10. An electronic device comprising the magnetic sensor according to claim 1.

11. A magnetic sensor according to claim 1, further comprising a reference voltage generation circuit adapted to divide the source voltage with voltage dividing resistors to generate the first reference voltage and the corrected first reference voltage,
wherein the reference voltage generation circuit includes:
a third variable resistor and a third resistor connected in series as voltage dividing resistors for generating the first reference voltage; and
a fourth variable resistor and a fourth resistor connected in series as voltage dividing resistors for generating the corrected first reference voltage, and
the threshold value adjuster includes the third and fourth variable resistors.

12. The magnetic sensor according to claim 1, wherein the first and second variable resistors include:
a plurality of resistors connected in series; and
a conduction adjuster connected in parallel with any of the plurality of resistors and adapted such that a conduction state thereof can be set arbitrarily.

13. The magnetic sensor according to claim 11, wherein the third and fourth variable resistors include:
a plurality of resistors connected in series; and
a conduction adjuster connected in parallel with any of the plurality of resistors and adapted such that a conduction state thereof can be set arbitrarily.

14. The magnetic sensor according to claim 12, further comprising a terminal for receiving a resistance control signal from an electronic device that incorporates the magnetic sensor, wherein the conduction state of the conduction adjuster is set according to the resistance control signal.

15. The magnetic sensor according to claim 13, further comprising a terminal for receiving a resistance control signal from an electronic device that incorporates the magnetic sensor, wherein the conduction state of the conduction adjuster is set according to the resistance control signal.

* * * * *